United States Patent [19]
Reardon, II, deceased et al.

[11] 4,125,310
[45] Nov. 14, 1978

[54] ELECTRICAL CONNECTOR ASSEMBLY UTILIZING WAFERS FOR CONNECTING ELECTRICAL CABLES

[76] Inventors: Patrick A. Reardon, II, deceased, late of Los Angeles, Calif.; by Jeanne A. Reardon, administratrix, 17310 Trosa St., Los Angeles, Calif. 91344

[21] Appl. No.: 636,514

[22] Filed: Dec. 1, 1975

[51] Int. Cl.$^2$ ........................ H01R 13/54; H05K 1/12
[52] U.S. Cl. ................................ 339/92 M; 339/17 F; 339/176 MF
[58] Field of Search ................ 339/17 F, 92 R, 92 M, 339/94 M, 176 MF; 174/63.5; 29/629; 156/3

[56] References Cited

U.S. PATENT DOCUMENTS

| | | | |
|---|---|---|---|
| 3,177,103 | 4/1965 | Tally et al. | 174/68.5 X |
| 3,466,206 | 9/1969 | Beck | 156/3 |
| 3,701,964 | 10/1972 | Cronin | 339/94 M X |
| 3,740,698 | 6/1973 | Jerominek | 339/17 F |
| 3,937,857 | 2/1976 | Brummett | 156/3 X |

*Primary Examiner*—Roy Lake
*Assistant Examiner*—E. F. Desmond
*Attorney, Agent, or Firm*—Lewis B. Sternfels; W. H. MacAllister

[57] ABSTRACT

Flexible or conventional wire cables are terminated and interconnected at connectors with only a pressure type contact. Two cable terminations are fabricated from identically chemically milled thin metallic wafers, in which one wafer is plated with metallic buttons. The two wafers are placed opposing each other and pressed between pressure plates with contact made only by the buttons. The plastic memory of the buttons is used as a spring, which is correlated with the force applied by the opposing plates.

11 Claims, 7 Drawing Figures

ELECTRICAL CONNECTOR ASSEMBLY UTILIZING WAFERS FOR CONNECTING ELECTRICAL CABLES

The invention herein described was made in the course of or under a contract or subcontract thereunder, with the Department of the Navy.

CROSS-REFERENCE TO RELATED APPLICATION

The present invention is related to copending patent application Ser. No. 636,504 entitled "Cable-To-Cable And Cable-To-Component Electrical Pressure Wafer Connector Assembly" by Norbert L. Moulin, filed herewith.

BACKGROUND OF THE INVENTION

1. Field of the Invention

The present invention relates to means for interconnecting electrical cables without use of conventional, frictionally engaging electrical connectors.

2. Description of the Prior Art

Conventional electrical cables are required to be compatible with standard connectors, such as pin and socket blade and tuning fork, and other friction type contact interfaces. While such connectors function well, they are generally bulky. In some cases, such bulk is unacceptable with flat cables. As is well known in the art, one advantage of flat cable is its thinness and ability to wind in and about electronic components and equipment. The use of conventional connectors may defeat the use of such flat cables. Friction also shortens the life of such connectors when repeated mating and unmating is required.

SUMMARY OF THE INVENTION

The present invention overcomes these and other problems. Briefly, the present invention comprises at least two cable terminations which are fabricated from identically formed thin metallic wafers. Metallic buttons are formed on the contact pads of one wafer so that, when the two wafers are placed opposing each other and pressed between two pressure plates, connections are made between the respective contact pads of the wafers by means of the buttons. The material of the buttons is capable of going into a plastic stage upon pressure exerted by the pressure plates so as to act as springs to maintain a constant force.

It is, therefore, an object of the present invention to provide for pressure type contact assembly.

Another object of the present invention is to provide for a minimum of bulk in connecting cables.

Another object of the present invention is to provide for a low cost electrical connector.

Another object of the present invention is to provide for a means for batch fabrication of the connectors.

Another object is to provide for a connector capable of being fabricated by conventional printed circuit processing.

Another object is to provide for even distribution of pressures between contacting wafers.

Other aims and objects as well as a more complete understanding of the present invention will appear from the following explanation of exemplary embodiments and the accompanying drawings thereof.

DESCRIPTION OF THE PREFERRED EMBODIMENT

Figure 1:
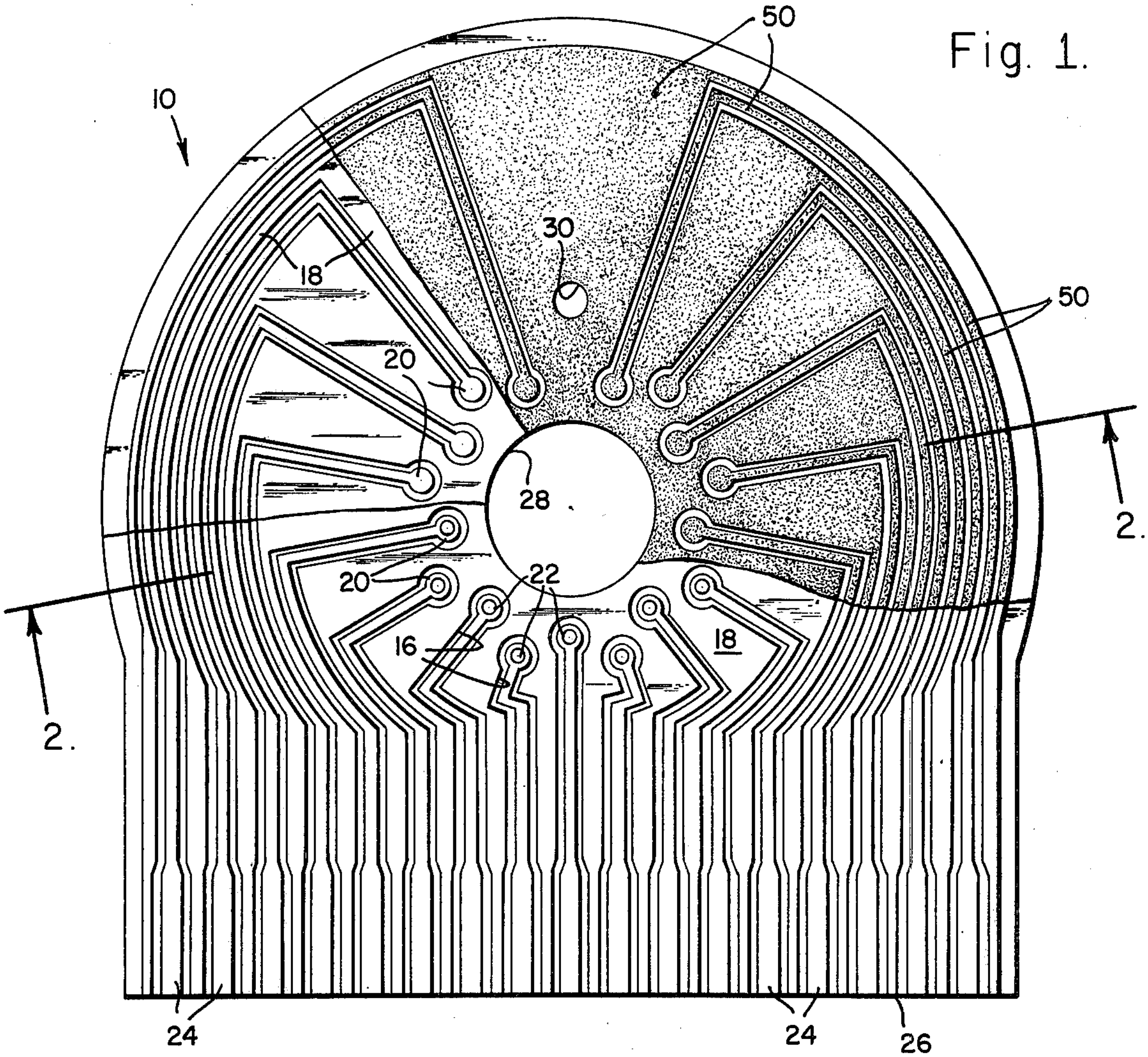
FIG. 1 is a plan view of a wafer of the present invention shown in various stages of fabrication.
Figure 2:
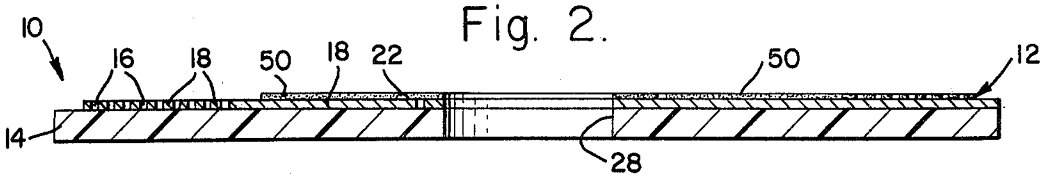
FIG. 2 is a cross-sectional view of the wafer of FIG. 1 taken along lines 2—2 thereof.

A wafer 10 comprises a layer or sheet of electrically conductive material 12, such as of 7 mil thick beryllium copper, adhered to a dielectric material 14, such as of polyimide. Sheet 12 has material removed therefrom to form grooves 16, such as by chemical etching or milling. Accordingly, sheet 12 comprises a plurality of conductor paths 18 terminating in contact pads 20 and, additionally on one wafer, are placed metallic buttons 22. The other ends 24 of conductive paths 18 extend to a common edge 26 for attachment to a flexible cable or conventional wire cable, such as by surface lap soldering. Preferably, a central hole 28 and an alignment hole 30 are placed through each wafer so as not only to obtain connection between a pair of wafers but also to align the respective contact pads on each of the two wafers.

Figure 3:
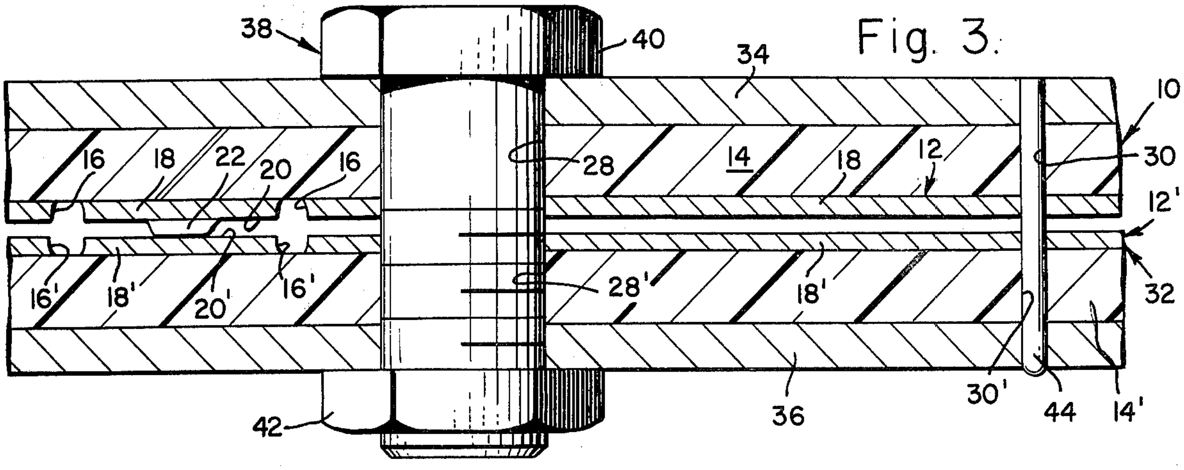
FIG. 3 is a view of the general means of securing two wafers together.

Specifically, as shown in FIG. 3, wafer 10 is secured to a cooperating wafer 32, both of which are of the same construction with the exception that wafer 32 is not provided with metallic buttons 22. In other respects, wafer 32 includes a dielectric material 14′, and a conductive sheet 12′ with grooves 16′ to form conductor paths 18′ terminating in contact pads 20′. Wafer 32 also is provided with a central hole 28′ and an alignment hole 30′. Preferably, wafers 10 and 32 are sandwiched between a pair of pressure plates 34 and 36 and clamped together by fastening means 38, such as by screws, bolts 40 and nuts 42, and alignment pins 44.

Figure 4:
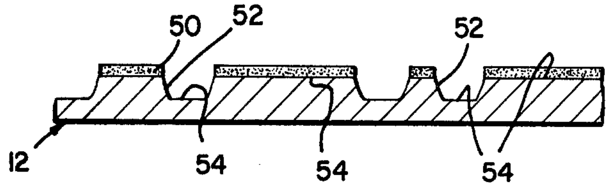
FIGS. 4–7 depict an illustrative means of forming the present invention.
Figure 5:
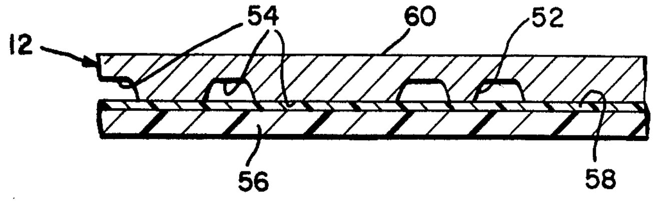
Figure 6:
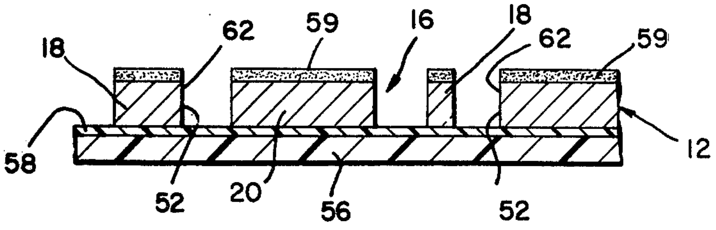

In the preparation of wafers 10 and 32, see FIGS. 1, 2 and 4–7, a sheet 12, such as of 7 mil thick beryllium copper, has a photoresist material 50 placed thereon. The photoresist material is configured so as to enable further delineation of the configuration of conductor paths 18 and contact pads 20. Sheet 12 is etched through approximately one-half its thickness to form half grooves 52 therein, as shown in FIG. 4. The processes utilized are conventional and are the same as those in ethcing of printed circuit boards. Photoresist mark 50 is then removed. As shown in FIG. 5 on surface 54 of sheet 12, which includes half grooves 52, is placed a dielectric material 56, such as polyimide, with an adhesive 58, such as pyralux, which may flow into or across etched grooves 52. Thereafter, as shown in FIG. 6, utilizing similar photoetching techniques and suitable art work configuration, including a photoresist mask 59, the other side 60 of sheet 12 is etched through to form half grooves 62, which extend to the previously made etched portion 52 to form therewith full grooves 16. Such etching, therefore, forms conductor paths 18 and contact pads 20. Mask 59 is removed.

Figure 7:
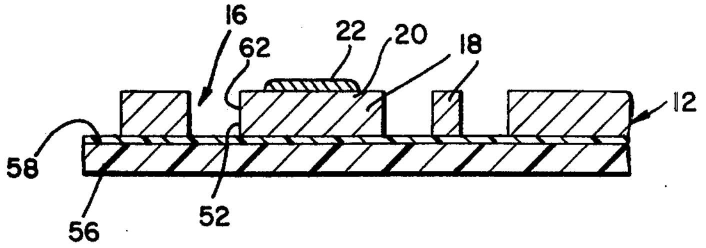

Then, as shown in FIG. 7, on only one of the wafers and by use of suitable artwork configuration, buttons 22 are formed on contact pads 20. Preferably, buttons 22 are formed by conventional photoresist and plating operations to form, at first, copper buttons of approximately 5–7 mils in diameter and 1–1.25 mils in height, which are plated onto the centers of contact pads 20. Thereafter, gold is plated onto the copper to a thickness of 100 to 250 millionths of a mil. The photoresist is then stripped off and a flash of gold is plated over both wafers.

Each wafer is then attached to its flexible cable or conventional wire cable in any convenient manner, such as by surface lap soldering. Both wafers are then placed opposing each other, as shown in FIG. 3, such that the exposed copper surfaces face the other one. They are sandwiched between pressure plates 34 and 36 and clamped by means of screws through one plate and threaded into the other plate. The force exerted by the plates brings each button 22 on one wafer in contact with the flat surface contact pad 20' of the other wafer.

The gold plate on the button flows to equalize the anomalies of the opposing surface, when a force of 1–2 lbs. per button is exerted. This force translates into 45,000–55,000 psi on the button surface. Since gold flows at 28,000 to 32,000 psi, a gas-tight seal is made between the two surfaces. At that pressure, the copper button goes into a plastic stage which performs as a spring, thereby maintaining a constant force.

Although the invention has been described with reference to particular embodiments thereof, it should be realized that various changes and modifications may be made therein without departing from the spirit and scope of the invention.

What is claimed is:

1. An electrical connector assembly comprising:
   - a first wafer having a surface and means on said surface for defining a pattern of first contact pads terminating first electrical conductors;
   - a second wafer having a surface contiguously mateable with said first wafer surface and means on said second wafer surface for defining a pattern of second contact pads terminating second electrical conductors having positions which mirror those of said pattern of first contact pads for enabling electrical contact between said electrical conductors of said first and second wafers;
   - means for securing said wafers together under pressure in the electrical contact and in a pre-selected orientation of said patterns of said first and second contact pads; and
   - buttons terminating said contact pads of said first wafer and extending from and above the surface of said first wafer, said buttons comprising conductive material having plastic memory and resiliently contacting said second contact pads, the pressure exerted by said securing means on said wafers not exceeding the limit of the collective plastic memory of said buttons for maintaining the spring resiliency of said buttons.

2. An electrical connector assembly as in claim 1 wherein said buttons are placed on and extend from and above the surface of said first contact pads.

3. An electrical connector assembly as in claim 2 wherein said patterns of first and second contact pads comprise beryllium copper of 7 mil thickness, and said buttons comprise copper of 5 to 7 mil diameter and 1 to 1.25 mil height on said first contact pads and gold of 100 to 250 millionths of an inch on said copper.

4. An electrical connector assembly as in claim 1 further comprising means for respectively and separately encasing said first and second electrical conductors in dielectric insulation for defining first and second flexible, flat cables.

5. An electrical connector assembly as in claim 4 wherein said first and second wafers are respectively affixed to said first and second flexible, flat cables.

6. An electrical connector assembly as in claim 5 wherein said means for securing said wafers together include a pair of pressure plates placed about said wafers for clamping said wafers together under the pressure.

7. An electrical connector assembly as in claim 6 wherein said means for securing said wafers together further include means for defining screws extending through one of said plates and threaded into the other of said plate.

8. An electrical connector assembly as in claim 1 wherein said buttons comprise copper plated with gold.

9. An electrical connector assembly as in claim 1 wherein each of said wafers includes a laminate of electrically conductive material and dielectric material adhered thereto, and means in said electrically conductive material for defining grooves therein and for defining a configuration of a plurality of conductor paths and said contact pads terminating said conductor paths in said electrically conductive material.

10. An electrical connector assembly as in claim 9 wherein said buttons are placed on and extend from the surface of said first contact pads.

11. An electrical connector assembly as in claim 10 wherein said laminate of electrically conductive material and said dielectric material respectively consist of beryllium copper and polyimide, adhered together by pyralux, and said buttons consist of copper plated with gold.

* * * * *

UNITED STATES PATENT AND TRADEMARK OFFICE
CERTIFICATE OF CORRECTION

PATENT NO. : 4,125,310

DATED : 14 November 1978

INVENTOR(S) : Patrick A. Reardon II

It is certified that error appears in the above—identified patent and that said Letters Patent is hereby corrected as shown below:

In the front page of the patent insert:
--[73] Assignee: Hughes Aircraft Company, Los Angeles, California--"

Signed and Sealed this

*Sixteenth* Day of *September 1986*

[SEAL]

*Attest:*

DONALD J. QUIGG

*Attesting Officer*

*Commissioner of Patents and Trademarks*